United States Patent
Yonezawa et al.

(10) Patent No.: US 9,515,664 B2
(45) Date of Patent: Dec. 6, 2016

(54) OSCILLATOR, ELECTRONIC APPARATUS, AND MOVING OBJECT

(71) Applicant: SEIKO EPSON CORPORATION, Tokyo (JP)

(72) Inventors: Takemi Yonezawa, Minowa-machi (JP); Tomohiro Uno, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/003,122

(22) Filed: Jan. 21, 2016

(65) Prior Publication Data
US 2016/0226497 A1 Aug. 4, 2016

(30) Foreign Application Priority Data
Jan. 30, 2015 (JP) ................................ 2015-017078

(51) Int. Cl.
*H03L 1/00* (2006.01)
*H03L 1/02* (2006.01)
*H03B 5/36* (2006.01)
*H03B 5/04* (2006.01)

(52) U.S. Cl.
CPC .................. *H03L 1/022* (2013.01); *H03B 5/04* (2013.01); *H03B 5/36* (2013.01); *H03B 5/362* (2013.01); *H03L 1/026* (2013.01)

(58) Field of Classification Search
CPC ............. H03B 5/56; H03B 5/04; H03B 5/362; H03L 1/026; H03L 1/022
USPC ......................... 331/158, 176, 116 R, 116 FE
See application file for complete search history.

(56) References Cited

U.S. PATENT DOCUMENTS

2014/0292423 A1\* 10/2014 Isohata ..................... H03L 1/04
331/70

FOREIGN PATENT DOCUMENTS

JP 2014-197751 A 10/2014

\* cited by examiner

*Primary Examiner* — Arnold Kinkead
(74) *Attorney, Agent, or Firm* — Oliff PLC

(57) ABSTRACT

An oscillator includes an oscillation element, an oscillation circuit, a heat generation element, a temperature control circuit, and a temperature correction signal generation circuit adapted to generate a temperature correction signal used to correct a frequency-temperature characteristic. The temperature correction signal generation circuit includes a temperature sensor, a first-order correction signal generation circuit adapted to generate a first-order correction signal, and a high-order correction signal generation circuit adapted to generate a high-order correction signal. The high-order correction signal generation circuit includes a high-temperature side second-order correction signal generation circuit, a high-temperature side polarity switching circuit adapted to switch a polarity of a high-temperature side second-order correction signal, a low-temperature side second-order correction signal generation circuit, and a low-temperature side polarity switching circuit adapted to switch a polarity of a low-temperature side second-order correction signal.

20 Claims, 12 Drawing Sheets

OSCILLATOR, ELECTRONIC APPARATUS, AND MOVING OBJECT

BACKGROUND

1. Technical Field

The present invention relates to an oscillator, an electronic apparatus, and a moving object.

2. Related Art

A crystal oscillator, which is used for a reference frequency signal source for communication equipment, a measurement instrument, or the like, is required to have the output frequency stable with high accuracy with respect to a temperature variation. In general, there is known an oven controlled crystal oscillator (OCXO) as a crystal oscillator capable of providing an extremely high frequency stability among crystal oscillators (JP-A-2014-197751 (Document 1)). The OCXO has a quartz resonator housed in an oven controlled in a constant temperature, and in order to realize the extremely high frequency stability, it is important to decrease the temperature control deviation of the oven with respect to the variation in the ambient temperature as much as possible.

FIG. 16(A) described in Document 1 is a diagram showing an example of a frequency-temperature characteristic in the case in which the temperature control of the oven is not performed in the OCXO using an SC-cut crystal resonator, and FIG. 16(B) and FIG. 16(C) are diagrams showing a part surrounded by a dotted line in FIG. 16 (A) in an enlarged manner. In the case in which, for example, the operating temperature range of the OCXO is −40° C. through +85° C., it is possible to output a stable frequency small in deviation even with a variation in the ambient temperature by keeping the temperature of the oven in the vicinity of 90° C. Although the accuracy of the oven varies between the products, in the case in which, for example, the temperature of the oven changes as much as ±2° C. around a peak of 90° C. when the ambient temperature varies up to a range of −40° C. through 85° C., the frequency deviation is about 20 ppb. In contrast, in the case in which the temperature of the oven, which is set to 90° C., actually becomes 92° C. shifted as much as 2° C., if the temperature of the oven changes as much as ±2° C. around the peak of 92° C., the frequency of the OCXO has a second-order temperature characteristic, and the frequency deviation becomes 40 ppb.

Further, an oscillation circuit and a frequency adjustment circuit also has a temperature characteristic, and the temperature characteristic has a variety of properties such as a contribution to linear reduction in frequency of the OCXO with respect to rise in temperature. Therefore, since the temperature characteristic of an electronic component of the oscillation circuit or the like is superimposed on the second-order frequency-temperature characteristic, in the OCXO of the related art, there is a problem that it is difficult to satisfy the requirement of the extremely high frequency stability.

SUMMARY

An advantage of some aspects of the invention is to provide an oscillator capable of realizing higher frequency stability than that of the oven controlled crystal oscillator (OCXO) of the related art, and an electronic apparatus and a moving object each using the oscillator.

The invention can be implemented as the following forms or application examples.

Application Example 1

An oscillator according to this application example includes an oscillation element, an oscillation circuit adapted to oscillate the oscillation element, a heat generation element adapted to heat the oscillation element, a temperature control circuit adapted to control the heat generation element, and a temperature correction signal generation circuit adapted to generate a temperature correction signal used to correct a frequency-temperature characteristic of an output signal of the oscillation circuit, the temperature correction signal generation circuit includes a temperature sensor, a first-order correction signal generation circuit adapted to generate a first-order correction signal used to perform a first-order correction, and a high-order correction signal generation circuit adapted to generate a high-order correction signal used to perform a high-order correction, and the high-order correction signal generation circuit includes a high-temperature side second-order correction signal generation circuit adapted to generate a high-temperature side second-order correction signal used to perform a second-order correction on a high-temperature side higher than temperature in linear region of the frequency-temperature characteristic, a high-temperature side polarity switching circuit adapted to switch a polarity of the high-temperature side second-order correction signal, a low-temperature side second-order correction signal generation circuit adapted to generate a low-temperature side second-order correction signal used to perform the second-order correction on a low-temperature side lower than temperature in the linear region, and a low-temperature side polarity switching circuit adapted to switch a polarity of the low-temperature side second-order correction signal.

According to the oscillator related to this application example, it is possible to control the internal temperature of the oscillator to be kept constant similarly to the oven controlled crystal oscillator (OCXO) of the related art, and further correct the frequency of the output signal of the oscillation circuit even in the case in which the internal temperature of the oscillator slightly varies due to the change in ambient temperature. Further, since the high-temperature side polarity switching circuit and the low-temperature side polarity switching circuit are provided, it becomes possible to perform a more appropriate correction than ever before, for example, it becomes possible to correct the second-order characteristic in the opposite direction and the quasi third-order characteristic to some extent. Therefore, the frequency stability higher than that of the oven controlled crystal oscillator (OCXO) of the related art can be realized.

Application Example 2

In the oscillator described above, it is also possible that the temperature correction signal generation circuit includes a composition circuit adapted to add the first-order correction signal and the high-order correction signal to each other.

Thus, the complicated correction signal can easily be generated.

Application Example 3

In the oscillator described above, it is also possible that a reference temperature, at which a frequency of the output signal does not change due to the first-order correction signal, is within a temperature range detected by the temperature sensor.

Thus, the frequency can appropriately be adjusted within the temperature range detected by the temperature sensor.

Application Example 4

In the oscillator described above, is also possible that the reference temperature can variably be set.

Thus, the frequency-temperature characteristic can flexibly and efficiently be corrected.

Application Example 5

In the oscillator described above, it is also possible that temperature, at which signal generation of one of the high-temperature side second-order correction signal generation circuit and the low-temperature side second-order correction signal generation circuit is started, is within a temperature range detected by the temperature sensor.

Thus, the frequency can appropriately be adjusted within the temperature range detected by the temperature sensor.

Application Example 6

In the oscillator described above, it is also possible that the temperature, at which the signal generation of the low-temperature side second-order correction signal generation circuit is started, is lower than the temperature, at which the signal generation of the high-temperature side second-order correction signal generation circuit is started.

Thus, it is possible to perform the correction corresponding to the frequency-temperature characteristic having the linear region.

Application Example 7

In the oscillator described above, it is also possible that the oscillation element is an SC-cut crystal resonator.

According to this application example, even by using the SC-cut crystal resonator showing the second-order frequency-temperature characteristic, the frequency stability higher than that of the oven controlled crystal oscillator (OCXO) of the related art can be realized.

Application Example 8

An electronic apparatus according to this application example includes any one of the oscillators described above.

Application Example 9

A moving object according to this application example includes any one of the oscillators described above.

According to these application examples, since there is included the oscillator having the high frequency stability, the electronic apparatus and the moving object higher in reliability can be realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, some preferred embodiments of the invention will be described in detail using the accompanying drawings. The drawings used herein are for the sake of convenience of explanation. It should be noted that the embodiments described below do not unreasonably limit the contents of the invention as set forth in the appended claims. Further, all of the constituents described below are not necessarily essential elements of the invention.

1. Oscillator

Figure 1:
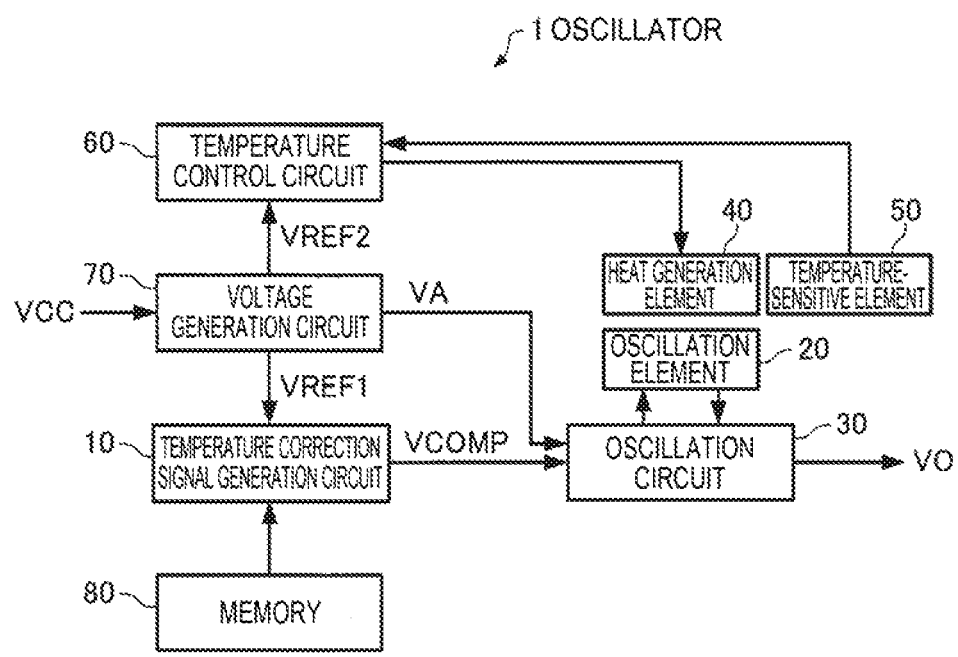
FIG. 1 is an example of a functional block diagram of an oscillator according to an embodiment of the invention.

FIG. 1 is an example of a functional block diagram of an oscillator 1 according to the embodiment. Further, FIGS. 2A and 2B are each an example of a cross-sectional view of the oscillator 1 according to the present embodiment.

As shown in FIG. 1, the oscillator 1 according to the present embodiment is configured including an oscillation element 20, an oscillation circuit 30 for oscillating the oscillation element 20, a heat generation element 40 for heating the oscillation element 20, a temperature-sensitive element 50, a temperature control circuit 60 for controlling the heat generation element 40, a temperature correction signal generation circuit 10 for generating a temperature correction signal for correcting a frequency-temperature characteristic of an output signal of the oscillation circuit 30, a voltage generation circuit 70, and a memory 80. It should be noted that the oscillator 1 according to the present embodiment can be provided with a configuration obtained by eliminating or modifying some of the constituents shown in FIG. 1, or adding other constituents.

In the present embodiment, a circuit part other than the oscillation element 20, the heat generation element 40, and the temperature-sensitive element 50 is realized by a one-chip IC 5 except some components (e.g., external resistors, external capacitors, and external coils). It should be noted that it is also possible to realize the circuit part with a plurality of IC chips, or to dispose the heat generation element 40 or the temperature-sensitive element 50 inside the one-chip IC 5.

Figure 2A:
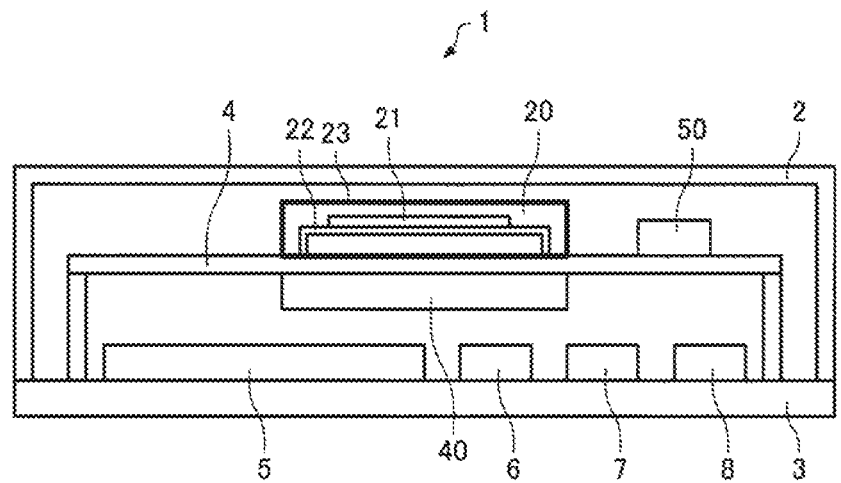
FIGS. 2A and 2B are each an example of a cross-sectional view of the oscillator according to the present embodiment.
Figure 2B:
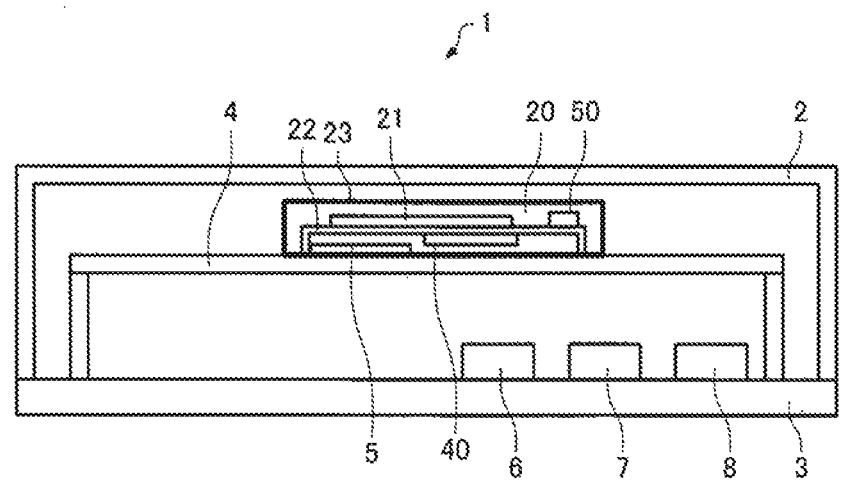

In the example shown in FIG. 2A, the oscillator 1 has the IC 5 and the external components 6, 7, and 8 such as resistors, capacitors, and coils mounted on an upper surface of a component mounting board 3. Further, a component mounting board 4 is disposed so as to be opposed to the component mounting board 3, and the oscillation element 20 and the temperature-sensitive element 50 are mounted on an upper surface of the component mounting board 4. On a lower surface of the component mounting board 4, there are mounted the heat generation element 40 at a position opposed to the oscillation element 20. The oscillation element 20 is configured including a component mounting board 22, and a resonator element 21 disposed on the component mounting board 22 inside a package 23.

In the example shown in FIG. 2B, the oscillator 1 has the IC 5 and the external components 6, 7, and 8 such as resistors, capacitors, and coils mounted on the upper surface of the component mounting board 3. Further, the component mounting board 4 is disposed so as to be opposed to the component mounting board 3, and the oscillation element 20 is mounted on the upper surface of the component mounting board 4. The oscillation element 20 is configured including the component mounting board 22, the resonator element 21 disposed on the component mounting board 22, the IC 5, the heat generation element 40, and the temperature-sensitive element 50 inside the package 23.

Terminals of the external components 6, 7, and 8, the oscillation element 20, the heat generation element 40, and the temperature-sensitive element 50 are electrically connected respectively to the desired terminals of the IC 5 with a wiring pattern not shown. Further, a case (or a cover) 2 is bonded to the component mounting board 3 so as to house the component mounting board 4, the IC 5, the external components 6, 7, and 8, the oscillation element 20, the heat generation element 40, and the temperature-sensitive element 50. The oscillator 1 uses a space formed by the case 2 and the component mounting board 3 as an oven, and is controlled so as to keep the temperature inside the oven constant using the heat generation element 40.

The voltage generation circuit 70 generates a power supply voltage VA of the oscillation circuit 30, a reference voltage VREF1 of the temperature correction circuit 10, a reference voltage VREF2 of the temperature control circuit 60, and so on.

The temperature correction circuit 10 generates a temperature correction voltage VCOMP for correcting the frequency-temperature characteristic of the output signal of the oscillation circuit 30. For example, the temperature correction circuit 10 can be capable of only a correction (hereinafter referred to as a "first-order correction") of a first-order component of the frequency-temperature characteristic of the output signal of the oscillation circuit 30, capable of only a correction (hereinafter referred to as a "second-order correction") of a second-order component thereof, or capable of both of the first-order correction and the second-order correction. Further, in the case in which the temperature correction circuit 10 is capable of both of the first-order correction and the second-order correction, the temperature correction circuit 10 can be capable of independently setting whether to make the first-order correction valid or invalid and whether to make the second-order correction valid or invalid, or capable of independently setting a correction parameter of the first-order correction and a correction parameter of the second-order correction. Further, the temperature correction circuit 10 can be capable of performing the second-order correction in a plurality of temperature ranges (e.g., a low-temperature side and a high-temperature side) independently of each other. It should be noted that a specific circuit configuration example of the temperature correction circuit 10 will be described later.

The oscillation circuit 30 oscillates the oscillation element 20 with a frequency corresponding to the temperature correction voltage VCOMP output by the temperature correction circuit 10.

Figure 3:
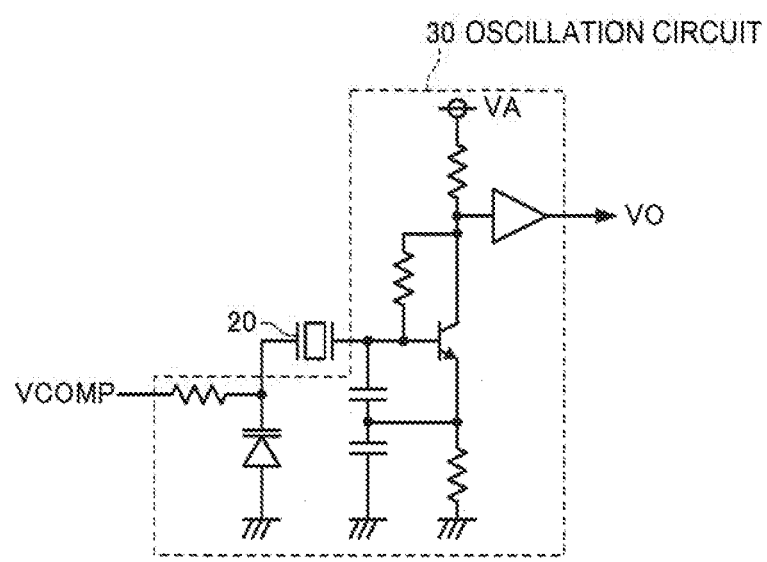
FIG. 3 is a diagram showing an example of an oscillation circuit.

FIG. 3 shows an example of the oscillation circuit 30. In the oscillation circuit 30 shown in FIG. 3, the temperature correction voltage VCOMP is applied to one end of a variable capacitance element (varicap diode), the capacitance value of the variable capacitance element varies in accordance with the voltage value, and thus, the oscillation frequency varies. It should be noted that it is also possible to use a capacitance bank, which has a plurality of capacitance elements (capacitors) connected in series to respective switches separated from each other and connected between one end of the oscillation element 20 and the ground in parallel to each other, instead of the variable capacitance element, and change setting of ON/OFF states of the respective switches to vary the capacitance value of the capacitance bank to thereby vary the oscillation frequency.

As the oscillation element 20, for example, an SC-cut or AT-cut crystal resonator or a surface acoustic wave (SAW) resonator can be used. Further, a piezoelectric resonator other than crystal resonators or an MEMS (micro electro mechanical systems) resonator, for example, can also be used as the oscillation element 20. As a substrate material of the oscillation element 20, there can be used, for example, a piezoelectric single crystal such as a quartz crystal, lithium tantalate, or lithium niobate, a piezoelectric material such as piezoelectric ceramics including, for example, lead zirconate titanate, or a silicon semiconductor material. Further, as an excitation device of the oscillation element 20, there can be used a device using a piezoelectric effect, or electrostatic drive using a coulomb force.

The temperature control circuit 60 controls the heat generation of the heat generation element 40 so as to keep the temperature constant in accordance with the output voltage of the temperature-sensitive element 50 disposed in the vicinity of the oscillation element 20.

As the head generation element 40, it is also possible to use, for example, an element (e.g., a power transistor or a resistor) generating heat by making a current flow therethrough. Further, as the temperature-sensitive element 50, there can be used, for example, a thermistor (e.g., an NTC (negative temperature coefficient) thermistor or a PTC (positive temperature coefficient) thermistor), or a platinum resistor.

For example, the temperature-sensitive element 50 having a positive temperature characteristic is disposed in the vicinity of the oscillation element 20 in advance, and it is possible for the temperature control circuit 60 to perform the control so as to make the current flow through the heat generation element 40 to generate heat when the output voltage of the temperature-sensitive element 50 is lower than a reference value, and to stop making the current flow through the heat generation element 40 when the output voltage of the temperature-sensitive element 50 is higher than the reference value.

Figure 4:
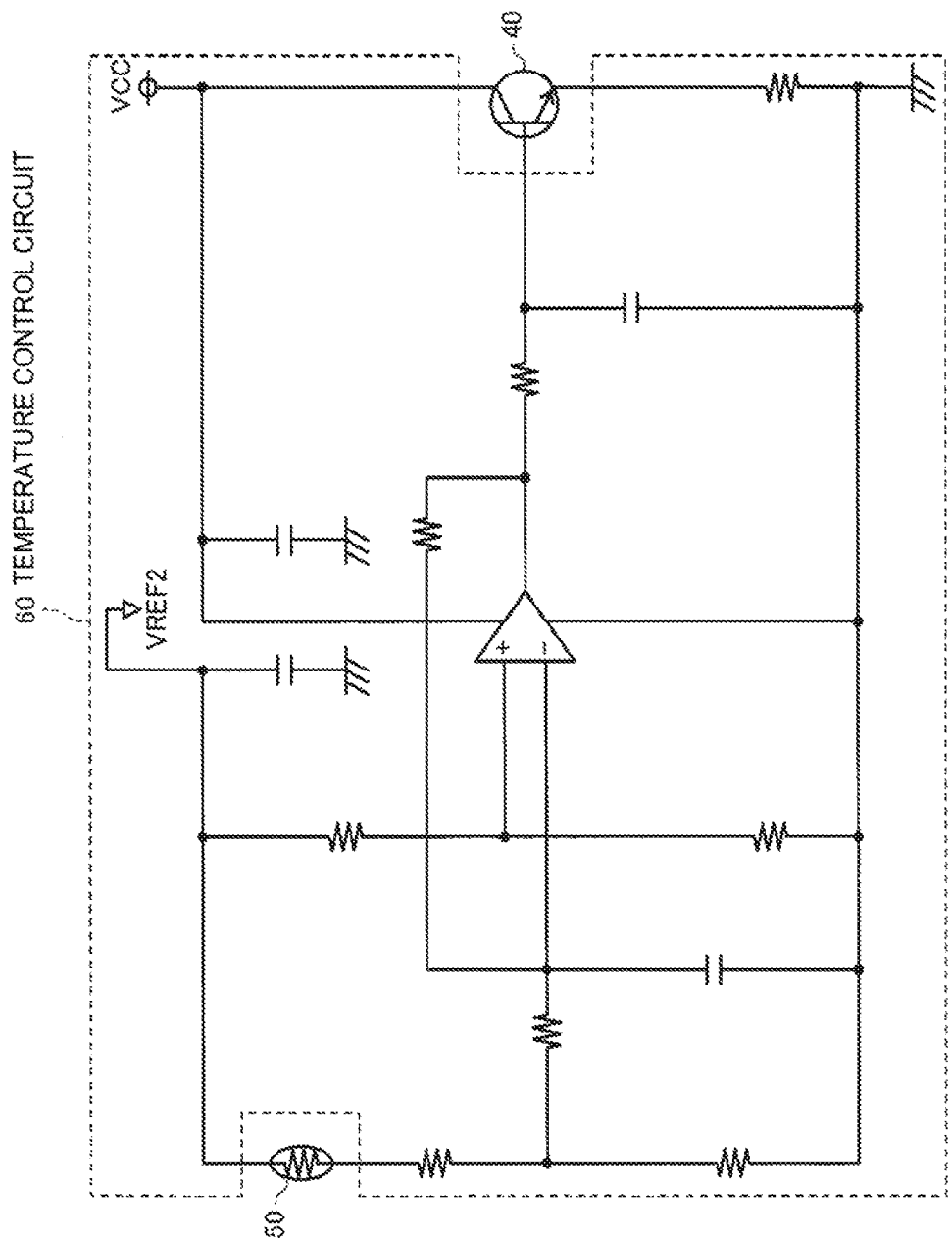
FIG. 4 is a diagram showing an example of a temperature control circuit.

FIG. 4 shows an example of the temperature control circuit 60. In FIG. 4, an NPN power transistor is used as the heat generation element 40, and an NTC thermistor is used as the temperature-sensitive element 50. In the temperature control circuit 60 shown in FIG. 4, when the temperature drops, the resistance value of the temperature-sensitive element 50 (the NTC thermistor) increases, and the input potential difference of an operational amplifier increases. In contrast, when the temperature rises, the resistance value of the temperature-sensitive element 50 (the NTC thermistor)

drops, and the input potential difference of the operational amplifier decreases. The output voltage of the operational amplifier is proportional to the input potential difference. In the heat generation element 40 (the NPN power transistor), when the output voltage of the operational amplifier is higher than a predetermined voltage value, the higher the output voltage is, the larger current flows to increase the amount of heat generation, and when the output voltage of the operational amplifier is lower than the predetermined voltage value, no current flows, and the amount of heat generation gradually decreases. Therefore, the operation of the heat generation element 40 is controlled so that the resistance value of the temperature-sensitive element 50 (the NTC thermistor) becomes a predetermined value, namely so as to keep the temperature-sensitive element 50 at predetermined temperature.

The memory 80 is a nonvolatile memory, and stores configuration information (e.g., the information regarding whether or not each of the first-order correction and the second-order correction is performed, the correction parameter of the first-order correction, and the correction parameter of the second-order correction) of the temperature correction circuit. The memory 80 can be realized by, for example, a flash memory such as an MONOS (metal-oxide-nitride-oxide-silicon) memory, an electrically erasable programmable read-only memory (EEPROM), or the like.

In the oscillator 1 according to the present embodiment having such a configuration, the internal temperature of the oven is controlled by the temperature control circuit 60 so as to be kept at predetermined temperature (e.g., the temperature at which the frequency becomes the highest if the oscillation element 20 is an SC-cut crystal resonator) based on the frequency-temperature characteristic of the output signal of the oscillation circuit 30 determined in accordance with the temperature characteristic of the oscillation element 20 and the circuit part. Further, the temperature correction circuit 10 corrects the small frequency deviation caused by a difference between the actual temperature inside the oven and the setting temperature due to a control error of the temperature control circuit 60. Thus, the frequency stability higher than that of the OCXO of the related art can be realized.

Figure 5:
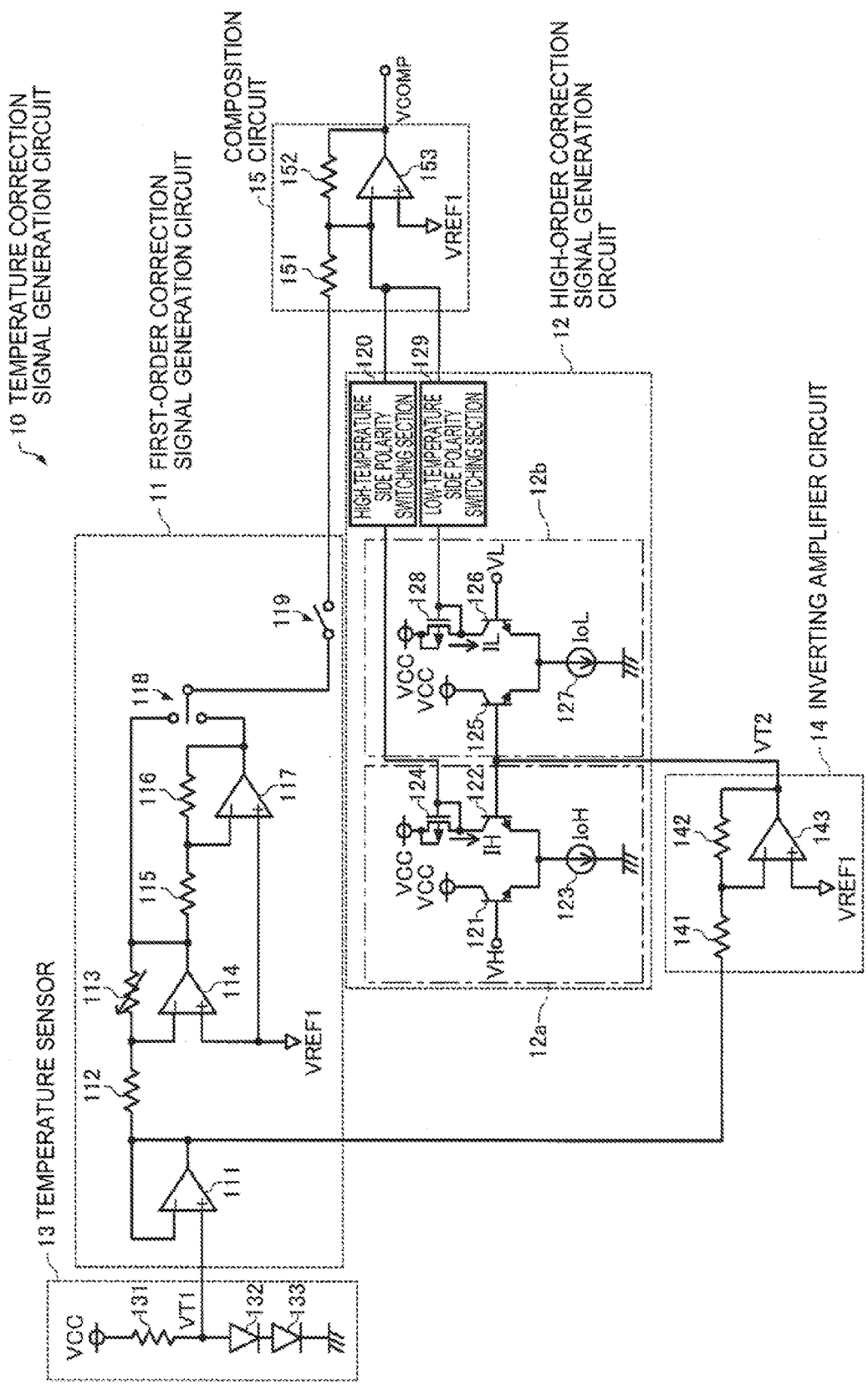
FIG. 5 is a diagram showing a configuration example of a temperature correction circuit according to the present embodiment.

Then, a configuration example of the temperature correction circuit capable of correcting the small frequency deviation will be explained in detail. FIG. 5 is a diagram showing a configuration example of the temperature correction circuit according to the present embodiment. As shown in FIG. 5, the temperature correction circuit 10 according to the present embodiment is configured including a first-order correction signal generation circuit 11 for generating a first-order correction signal used for performing the first-order correction, a high-order correction signal generation circuit 12 for generating a high-order correction signal used for performing a high-order correction, a temperature sensor 13, an inverting amplifier circuit 14, and a composition circuit 15. It should be noted that the temperature correction circuit 10 according to the present embodiment can be provided with a configuration obtained by eliminating or modifying some of the constituents shown in FIG. 5, or adding other constituents thereto.

The temperature sensor 13 is configured including a resistor 131, and diodes 132, 133. The resistor 131 has a first terminal supplied with the power supply voltage VCC and a second terminal connected to an anode terminal of the diode 132. Further, the cathode terminal of the diode 132 and the anode terminal of the diode 133 are connected to each other, and the cathode terminal of the diode 133 is grounded.

Further, a signal of a node between the second terminal of the resistor 131 and the anode terminal of the diode 132 is used as an output voltage VT1 of the temperature sensor 13. For example, the voltage applied to both of the terminals of each of the diodes 132, 133 drops by 2 mV with respect to temperature rise of 1° C. Therefore, the output voltage VT1 linearly varies with a negative slope with respect to the variation in the internal temperature of the oven.

The first-order correction signal generation circuit 11 is configured including operational amplifiers 111, 114, and 117, resistors 112, 115, and 116, a variable resistor 113, and switches 118, 119. The operational amplifier 111 has a non-inverting input terminal (+input terminal), to which the output voltage VT1 of the temperature sensor 13 is input, and an inverting input terminal (−input terminal) and an output terminal both connected to a first terminal of the resistor 112. In other words, the operational amplifier 111 buffers and outputs the output voltage VT1 of the temperature sensor 13. A second terminal of the resistor 112 is connected to the inverting input terminal (−input terminal) of the operational amplifier 114 and a first terminal of the variable resistor 113. To the non-inverting input terminal (+input terminal) of the operational amplifier 114, there is input the reference voltage VREF1, and the output terminal of the operational amplifier 114 is connected to a second terminal of the variable resistor 113, a first terminal of the resistor 115, and a first input terminal of the switch 118. A second terminal of the resistor 115 is connected to the inverting input terminal (−input terminal) of the operational amplifier 117 and a first terminal of the resistor 116. To the non-inverting input terminal (+input terminal) of the operational amplifier 117, there is input the reference voltage VREF1, and the output terminal of the operational amplifier 117 is connected to a second terminal of the resistor 116 and a second input terminal of the switch 118. The output terminal of the switch 118 is connected to a first terminal of a switch 119, and the voltage of a second terminal of the switch 119 is used as an output voltage (a first-order correction voltage) of the first-order correction signal generation circuit 11. When the switch 119 is in the ON state, the first-order correction voltage linearly varies in accordance with the change in output voltage VT1 of the temperature sensor 13 (in accordance with the internal temperature of the oven).

By changing the resistance value of the variable resistor 113, the amount of slope of the first-order correction voltage with respect to the output voltage VT1 can be changed. Further, by switching the switch 118, the polarity (positive or negative) of the slope of the first-order correction voltage can also be changed. Further, by switching OFF the switch 119, it is also possible to always set the first-order correction voltage to a high impedance state irrespective of the output voltage VT1 to thereby invalidate the first-order temperature correction. The information regarding whether to validate or invalidate the correction by the first-order correction signal generation circuit 11 (the information regarding the ON/OFF state of the switch 119) and the correction parameter of the first-order correction signal generation circuit 11 (the information of the resistance value of the variable resistor 113 and the connection information of the switch 118) are stored in the memory 80.

The inverting amplifier circuit 14 is configured including an operational amplifier 143 and resistors 141, 142. The resistor 141 has a first terminal connected to the output terminal of the operational amplifier 111, and a second terminal connected to the inverting input terminal (−input terminal) of the operational amplifier 143 and a first terminal of the resistor 142. To the non-inverting input terminal (+input terminal) of the operational amplifier 143, there is input the reference voltage VREF1, and the output terminal of the operational amplifier 143 is connected to a second terminal of the resistor 142. Further, an output voltage of the operational amplifier 143 is used as an output voltage VT2 of the inverting amplifier circuit 14. By the inverting amplifier circuit 14 having such a configuration, there can be obtained the voltage VT2 obtained by inverting and amplifying the output voltage (i.e., output voltage VT1) of the operational amplifier 111 with reference to the reference voltage VREF1. Therefore, the output voltage VT2 linearly varies with a positive slope with respect to the variation in the internal temperature of the oven.

The high-order correction signal generation circuit is configured including a high-temperature side second-order correction signal generation circuit 12a for generating a high-temperature side second-order correction signal used for performing the second-order correction on the high-temperature side higher than the temperature in the linear region of the frequency-temperature characteristic, a high-temperature side polarity switching circuit 120 for switching the polarity of the high-temperature side second-order correction signal, a low-temperature side second-order correction signal generation circuit 12b for generating a low-temperature side second-order correction signal used for performing the second-order correction on the low-temperature side lower than the temperature in the linear region of the frequency-temperature characteristic, and a low-temperature side polarity switching circuit 129 for switching the polarity of the low-temperature side second-order correction signal.

The high-temperature side second-order correction signal generation circuit 12a is configured including NPN transistors 121, 122, a constant current source 123, and an NMOS transistor 124 for a current mirror.

The low-temperature side second-order correction signal generation circuit 12b is configured including NPN transistors 125, 126, a constant current source 127, and an NMOS transistor 128 for a current mirror.

To the base terminal of the transistor 121, there is input a constant reference voltage VH, and to the collector terminal of the transistor 121, there is input the power supply voltage VCC. The emitter terminal of the transistor 121 and the emitter terminal of the transistor 122 are both connected to a first terminal of the constant current source 123, and a second terminal of the constant current source 123 is grounded. To the base terminal of the transistor 122, there is input the output voltage VT2 of the inverting amplifier circuit 14, and the collector terminal of the transistor 122 is connected to the source terminal and the gate terminal of the NMOS transistor 124. To the drain terminal of the NMOS transistor 124, there is input the power supply voltage VCC. The transistors 121, 122 and the constant current source 123 constitute a first differential amplifier circuit. A constant current IoH flows through the constant current source 123, and when the output voltage VT2 is equal to the reference voltage VH, the current IH flowing between the emitter and the collector of the transistor 122 is obtained as IH=IoH/2. Further, in the range in which the output voltage VT2 is higher than the reference voltage VH, the higher the output voltage VT2 becomes (the higher the internal temperature of the oven becomes), the higher the current IH becomes nonlinearly, and the closer to the constant current IoH the current IH becomes. In contrast, in the range in which the output voltage VT2 is lower than the reference voltage VH, the lower the output voltage VT2 becomes (the lower the internal temperature of the oven becomes), the lower the current IH becomes nonlinearly, and the closer to 0 the current IH becomes.

To the base terminal of the transistor 125, there is input the output voltage VT2 of the inverting amplifier circuit 14, and to the collector terminal of the transistor 125, there is input the power supply voltage VCC. The emitter terminal of the transistor 125 and the emitter terminal of the transistor 126 are both connected to a first terminal of the constant current source 127, and a second terminal of the constant current source 127 is grounded. To the base terminal of the transistor 126, there is input a constant reference voltage VL different from the reference voltage VH, and the collector terminal of the transistor 126 is connected to the source terminal and the gate terminal of the NMOS transistor 128. To the drain terminal of the NMOS transistor 128, there is input the power supply voltage VCC. The transistors 125, 126 and the constant current source 127 constitute a second differential amplifier circuit. A constant current IoL flows through the constant current source 127, and when the output voltage VT2 is equal to the reference voltage VL, the current IL flowing between the emitter and the collector of the transistor 126 is obtained as IL=IoL/2. Further, in the range in which the output voltage VT2 is lower than the reference voltage VL, the lower the output voltage VT2 becomes (the lower the internal temperature of the oven becomes), the higher the current IL becomes nonlinearly, and the closer to the constant current IoL the current IL becomes. In contrast, in the range in which the output voltage VT2 is higher than the reference voltage VL, the higher the output voltage VT2 becomes (the higher the internal temperature of the oven becomes), the lower the current IL becomes nonlinearly, and the closer to 0 the current IL becomes.

Figure 6:
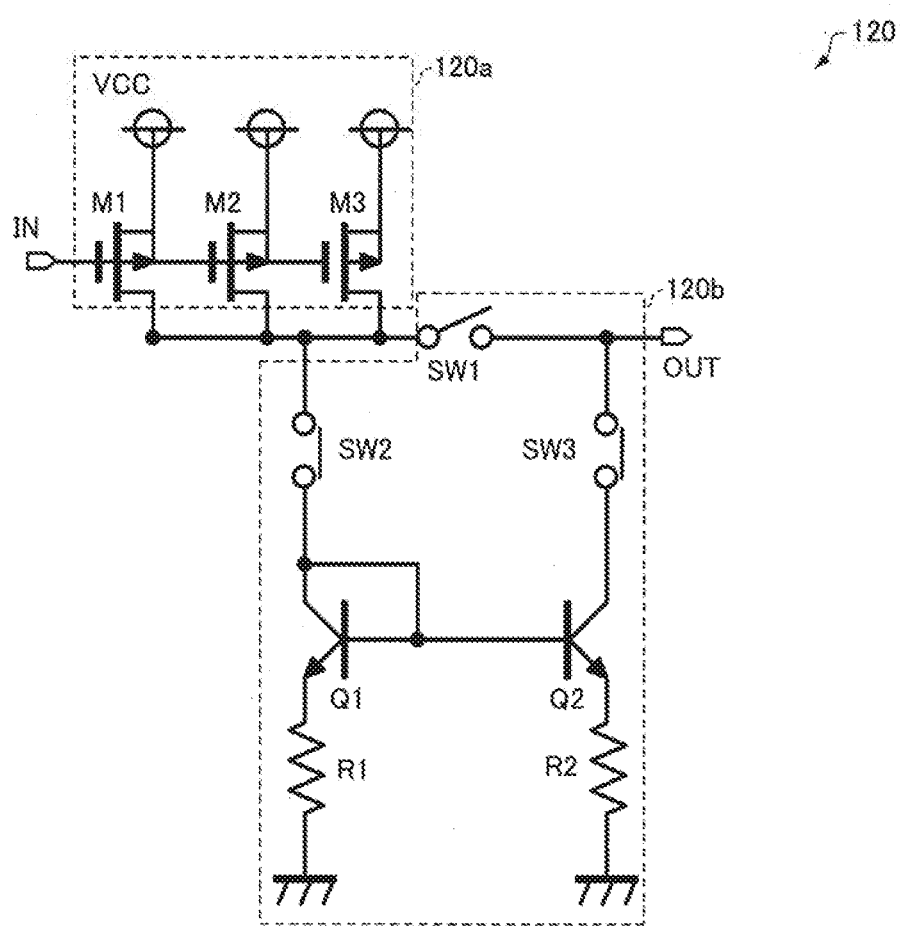
FIG. 6 is a diagram showing a configuration example of a high-temperature side polarity switching circuit according to the present embodiment.

FIG. 6 is a diagram showing a configuration example of the high-temperature side polarity switching circuit 120 according to the present embodiment. It should be noted that the configuration of the low-temperature side polarity switching circuit 129 is substantially the same as that of the high-temperature side polarity switching circuit 120.

In the example shown in FIG. 6, the high-temperature side polarity switching circuit 120 is configured including a gain switching section 120a and a polarity switching section 120b.

The gain switching section 120a is configured including NMOS transistors M1 through M3. The gate terminals of the NMOS transistors M1 through M3 are commonly connected to each other, and are connected to the gate terminal of the NMOS transistor 124. The drain terminals of the NMOS transistors M1 through M3 are commonly connected to each other, and the power supply voltage VCC is input to the drain terminals. The source terminals of the NMOS transistors M1 through M3 are commonly connected to each other, and are connected to one end of a switch SW1 of the polarity switching section 120b and one end of a switch SW2 of the polarity switching section 120b. A current proportional to the current IH flows through the NMOS transistors M1 through M3. Since the mirror ratio of the current can be changed by validating or invalidating the NMOS transistors M1 through M3 using switches not shown, the gain of the high-temperature side second-order correction signal can be switched.

The polarity switching section 120b is configured including transistors Q1, Q2, which are NPN transistors, switches SW1 through SW3, and resistors R1, R2. The collector terminal of the transistor Q1 is connected to the other end of the switch SW2, and at the same time connected to the base terminals of the transistors Q1, Q2. The emitter terminal of the transistor Q1 is connected to the ground potential via the resistor R1. The collector terminal of the transistor Q2 is connected to one end of the switch SW3. The emitter terminal of the transistor Q2 is connected to the ground potential via the resistor R2. The other end of the switch SW1 and the other end of the switch SW3 are commonly connected to each other to form an output terminal with respect to the composition circuit 15.

In the case of setting the switch SW1 of the polarity switching section 120b to the ON state, and setting the switches SW2, SW3 to the OFF state, the polarity switching section 120b outputs the output current of the gain switching section 120a directly to the composition circuit 15. In contrast, in the case of setting the switch SW1 of the polarity switching section 120b to the OFF state, and setting the switches SW2, SW3 to the ON state, the polarity switching section 120b outputs a current having a direction opposite to that of the direction of the output current of the gain switching section 120a to the composition circuit 15. Therefore, by switching the switches SW1 through SW3, the polarity of the high-temperature side second-order correction signal can be switched.

The composition circuit 15 adds the first-order correction signal and the high-order correction signal to each other. In the example shown in FIG. 5, the composition circuit 15 is configured including an operational amplifier 153 and resistors 151, 152. The resistor 151 has a first terminal connected to the second terminal of the switch 119, and a second terminal connected to the inverting input terminal (−input terminal) of the operational amplifier 153, a first terminal of the resistor 152, the output terminal of the high-temperature side polarity switching circuit 120, and the output terminal of the low-temperature side polarity switching circuit 129. To the non-inverting input terminal (+input terminal) of the operational amplifier 153, there is input the reference voltage VREF1, and the output terminal of the operational amplifier 153 is connected to a second terminal of the resistor 152. Further, an output voltage of the operational amplifier 153 is used as an output voltage of the composition circuit 15. The composition circuit 15 having such a configuration outputs a voltage obtained by adding the output voltage (the first-order correction signal) of the first correction signal generation circuit 11 and the output voltage (the high-order correction signal) of the high-order correction signal generation circuit 12 to each other, and this voltage is used as the temperature correction voltage VCOMP, which is an output voltage of the temperature correction circuit 10.

When the outside air temperature rises, the internal temperature of the oven also rises slightly, and when the outside air temperature drops, the internal temperature of the oven also drops slightly. In the case of, for example, setting the internal temperature of the oven to the temperature (e.g., 90° C.) at which the frequency of the oscillator 1 becomes the highest, if the internal temperature of the oven coincide with the setting temperature when the outside air temperature is equal to the reference temperature (e.g., 25° C.), the frequency deviation of the frequency of the oscillator 1 is small even in the case in which the internal temperature of the oven varies slightly (e.g., within a range of 88° C. through 92° C.) within the temperature range (e.g., a range of −30° C. through 85° C.) in which the operation of the oscillator 1 is guaranteed. However, if the internal temperature of the oven is shifted from the setting temperature when the outside air temperature is equal to the reference temperature (e.g., 25° C.), the frequency deviation becomes large in the vicinities (e.g., the vicinity of −30° C. and the vicinity of 85° C.) of ends of the operation guarantee temperature range (e.g., −30° C. through 85° C.). Therefore, in the present embodiment, the frequency deviation in the vicinities of the ends of the operation guarantee temperature range is efficiently decreased using the second-order temperature correction.

Figure 7A:
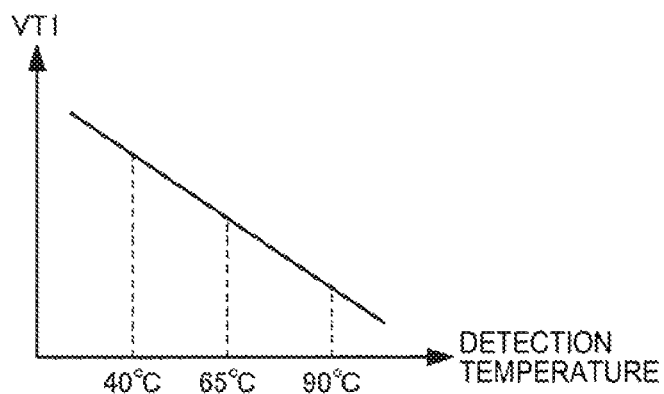
FIGS. 7A through 7D are explanatory diagrams regarding second-order temperature correction according to the present embodiment.
Figure 7B:
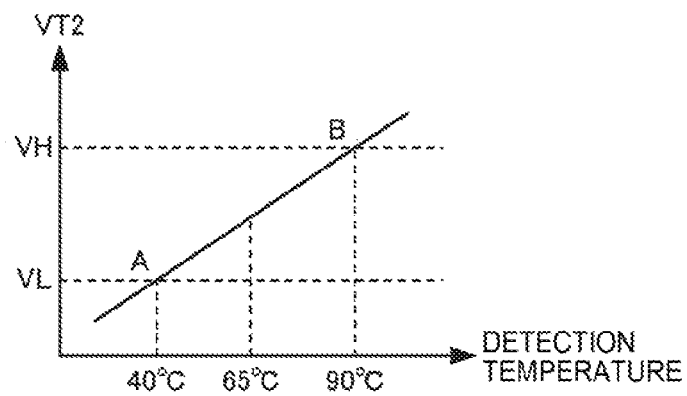
Figure 7C:
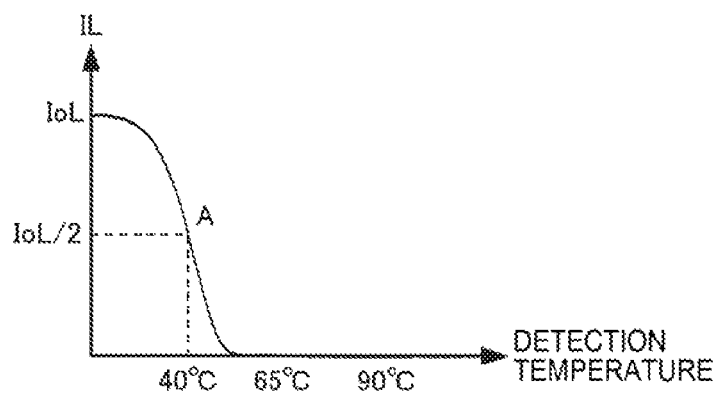
Figure 7D:
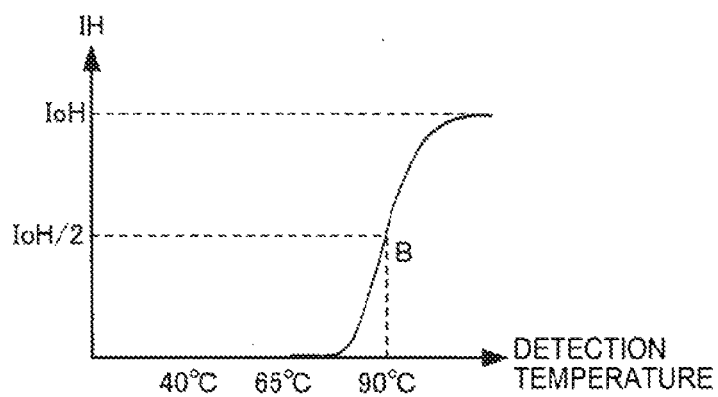

FIGS. 7A through 7D, 8A, 8B, 9A, 9B, 10A, and 10B are diagrams for explaining the second-order temperature correction according to the present embodiment. As shown in FIG. 7A, the output voltage VT1 varies with a negative slope with respect to the variation in a range of 40° C. through 90° C. of the detection temperature of the temperature sensor 13 (hereinafter simply referred to as "detection temperature"). As shown in FIG. 7B, the output voltage VT2 varies with a positive slope with respect to the variation in a range of 40° C. through 90° C. of the detection temperature. Here, the slope is adjusted in advance so that, for example, VT2=VL is satisfied in the case in which the detection temperature is 40° C., and VT2=VH is satisfied in the case in which the detection temperature is 90° C. In this case, as shown in FIG. 7C, IL=IoL/2 is satisfied at the detection temperature of 40° C., and the current IL nonlinearly increases as the detection temperature drops in the case in which the detection temperature is in the vicinity of 40° C. At the detection temperature of 65° C. or 90° C., IL≈0 is satisfied. Further, as shown in FIG. 7D, IH=IoH/2 is satisfied at the detection temperature of 90° C., and the current IH linearly increases as the detection temperature rises in the case in which the detection temperature is in the vicinity of 90° C. At the detection temperature of 65° C. or 40° C., is satisfied. Therefore, the second-order correction voltage is determined by the current IL on the low temperature side, and is determined by the current IH on the high temperature side.

Figure 8A:
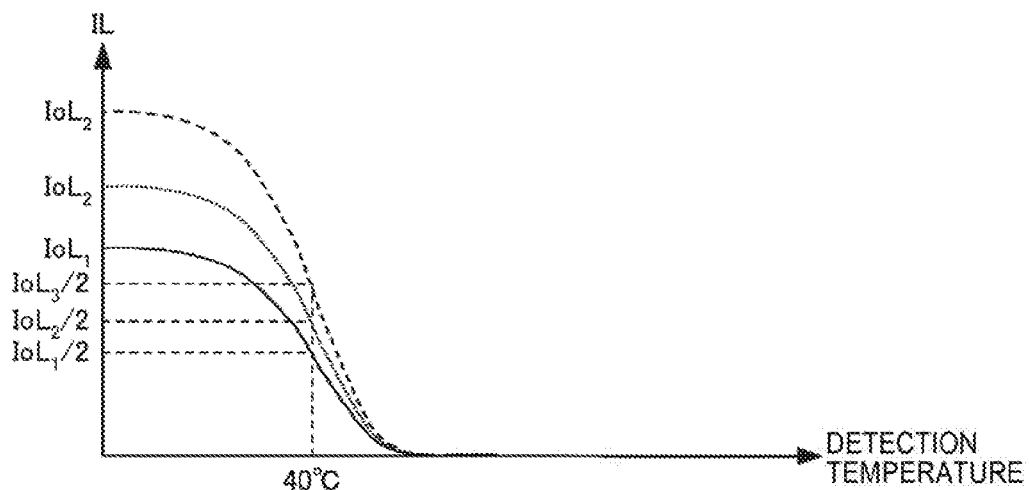
FIGS. 8A and 8B are explanatory diagrams regarding the second-order temperature correction according to the present embodiment.
Figure 8B:
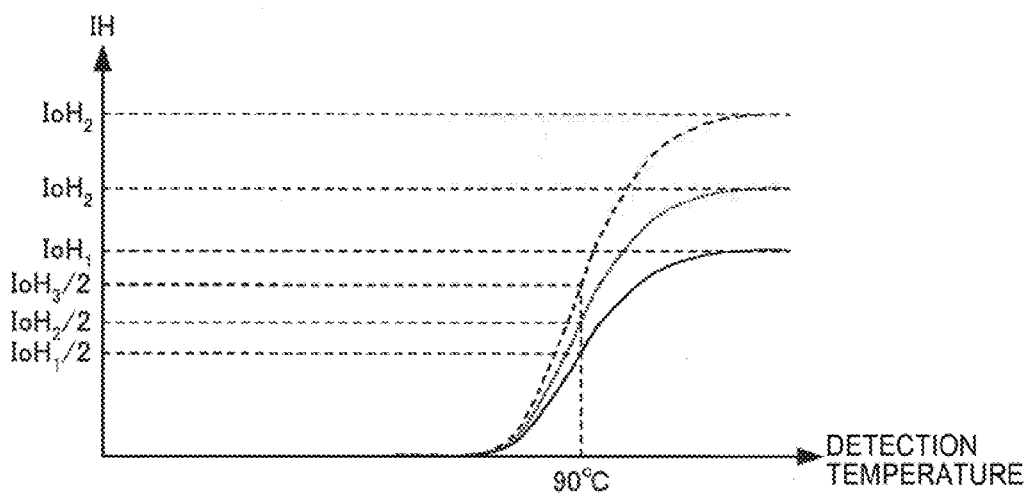

Further, as shown in FIG. 8A, by changing the current IoL flowing through the constant current source 127, the slope of the current IL with respect to the variation in detection temperature can be changed. Specifically, the higher the current IoL is, the steeper the slope of the current IL becomes. Similarly, as shown in FIG. 8B, by changing the current IoH flowing through the constant current source 123, the slope of the current TH with respect to the variation in detection temperature can be changed. Specifically, the higher the current IoH is, the steeper the slope of the current IH becomes. Therefore, by measuring the frequency-temperature characteristic of the output signal of the oscillation circuit 30, and then adjusting the current IoL and the current IoH so as to correct the drop of the frequency on the low temperature side and the high temperature side, the second-order component of the frequency deviation can efficiently be reduced.

Figure 9A:
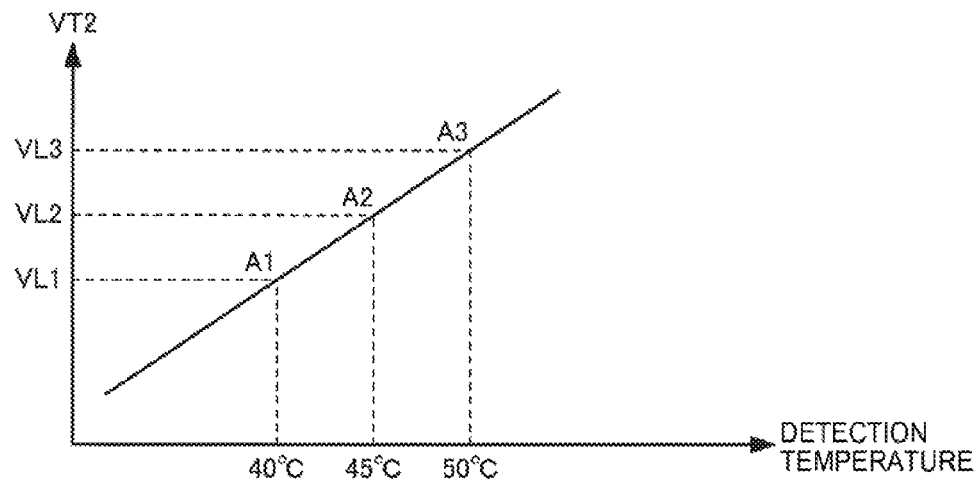
FIGS. 9A and 9B are explanatory diagrams regarding the second-order temperature correction according to the present embodiment.
Figure 9B:
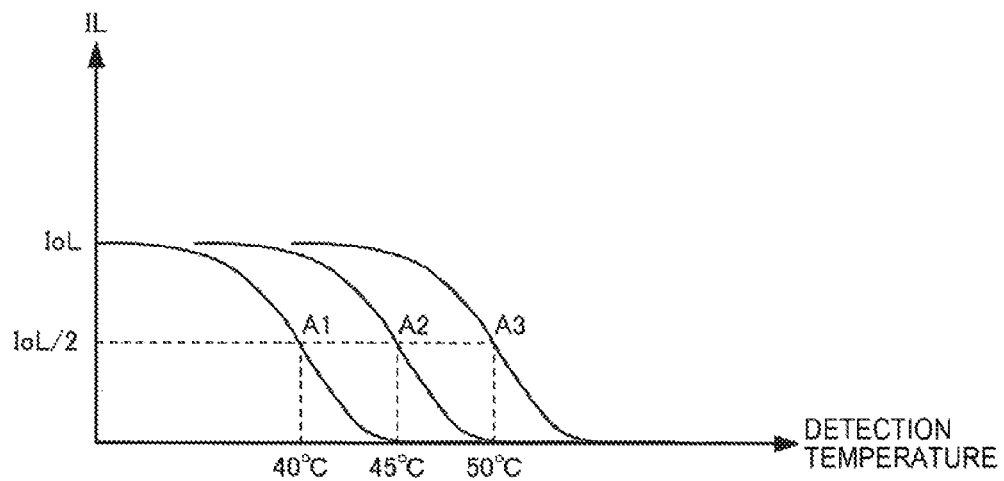
Figure 10A:
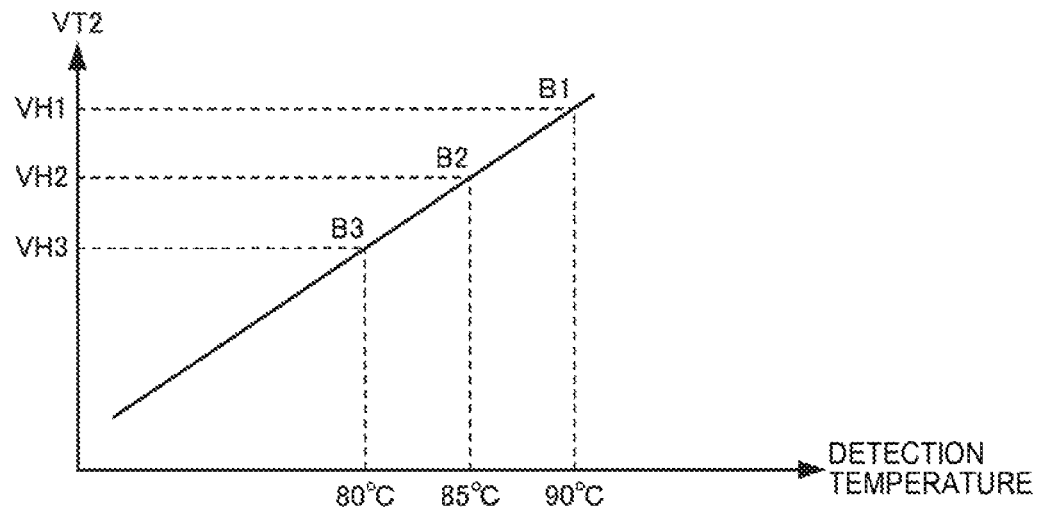
FIGS. 10A and 10B are explanatory diagrams regarding the second-order temperature correction according to the present embodiment.
Figure 10B:
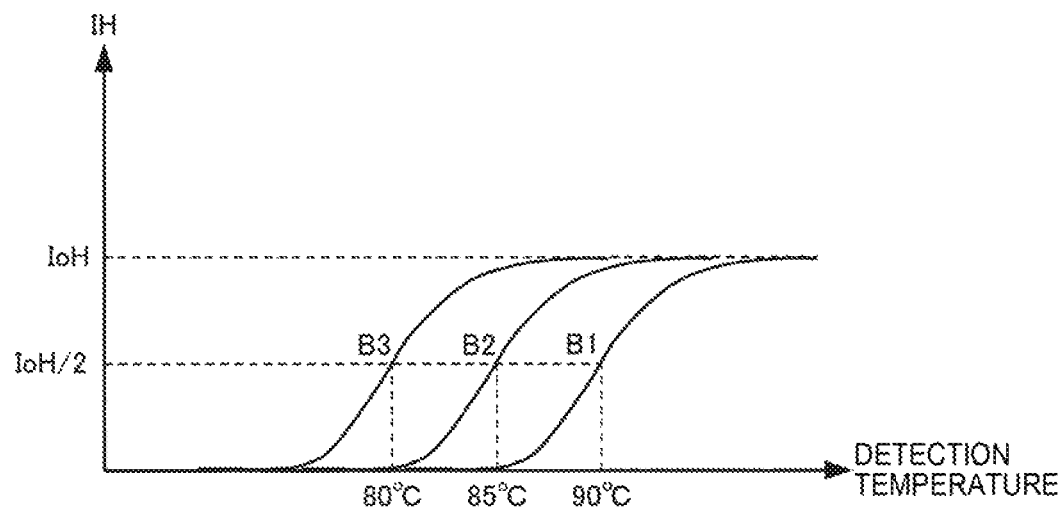

Since the operation guarantee temperature range of the oscillator 1 varies with the purpose, the second-order temperature correction in accordance with the operation guarantee temperature range becomes necessary. Therefore, in the present embodiment, by changing the reference voltages VL, VH, the detection temperature, at which IL=IoL/2 is satisfied, and the detection temperature, at which IH=IoH/2 is satisfied, are changed. In the case in which, for example, the output voltage VT2 takes voltage values VL1, VL2, and VL3 at the detection temperature of 40° C., 45° C., and 50° C., respectively, as shown in FIG. 9A, by setting the reference voltage VL to VL=VL1, VL2, and VL3, respectively, as shown in FIG. 9B, IL=IoL/2 is satisfied at the temperature of 40° C., 45° C., and 50° C., respectively. Similarly, in the case in which, for example, the output voltage VT2 takes voltage values VH1, VH2, and VH3 at the detection temperature of 90° C., 85° C., and 80° C., respectively, as shown in FIG. 10A, by setting the reference voltage VH to VH=VH1, VH2, and VH3, respectively, as shown in FIG. 10B, IH=IoH/2 is satisfied at the temperature of 90° C., 85° C., and 80° C., respectively. Therefore, by adjusting the reference voltages VL, VH in accordance with the operation guarantee temperature range, the second-order component of the frequency deviation can efficiently be reduced.

Further, by switching the polarity of the high-order correction signal using the high-temperature side polarity switching circuit 120 and the low-temperature side polarity switching circuit 120, it is possible to also correct a second-order characteristic in an opposite direction and a quasi third-order characteristic.

These correction parameters (IOL, IoH, VL, and VH) of the second-order correction circuit 11 are stored in the memory 80.

According to the oscillator 1 related to the present embodiment, it is possible to control the internal temperature of the oscillator 1 to be kept constant similarly to the oven controlled crystal oscillator (OCXO) of the related art, and further correct the frequency of the output signal of the oscillation circuit 30 even in the case in which the internal temperature of the oscillator slightly varies due to a change in ambient temperature. Further, since the high-temperature side polarity switching circuit 120 and the low-temperature side polarity switching circuit 129 are provided, it becomes possible to perform a more appropriate correction than ever before, for example, it becomes possible to correct the second-order characteristic in the opposite direction (an upward-convex second-order characteristic and a downward-convex second-order characteristic) and the quasi third-order characteristic to some extent. Therefore, the frequency stability higher than that of the oven controlled crystal oscillator (OCXO) of the related art can be realized.

As described above, in the oscillator 1 according to the present embodiment, the temperature correction signal generation circuit 10 is configured including the composition circuit 15. Thus, the complicated correction signal can easily be generated.

In the oscillator 1 according to the present embodiment, the reference temperature at which the frequency of the output signal of the oscillation circuit 30 does not vary due to the first-order correction signal can also be within the temperature range detected by the temperature sensor 13. Thus, the frequency can appropriately be adjusted within the temperature range detected by the temperature sensor 13. In this case, the reference temperature at which the frequency of the output signal of the oscillation circuit 30 does not vary due to the first-order correction signal can also variably be set. Thus, the frequency-temperature characteristic can flexibly and efficiently be corrected.

In the oscillator 1 according to the present embodiment, the temperatures (the temperatures viewed in the direction of getting away from the central temperature in the linear region), at which the signal generation of the high-temperature side second-order correction signal generation circuit 12a and the low-temperature side second-order correction signal generation circuit 12b is started, can also be within the temperature range detected by the temperature sensor 13. Thus, the frequency can appropriately be adjusted within the temperature range detected by the temperature sensor 13.

In the oscillator 1 according to the present embodiment, the temperature, at which the signal generation of the low-temperature side second-order correction signal generation circuit 12b is started, can also be lower than the temperature, at which the signal generation of the high-temperature side second-order correction signal generation circuit 12a is started. Thus, it is possible to perform the correction corresponding to the frequency-temperature characteristic having the linear region.

In the oscillator 1 according to the present embodiment, the oscillation element 20 (the resonator element 21) can also be an SC-cut crystal resonator. In the present embodiment, even by using the SC-cut crystal resonator showing the second-order frequency-temperature characteristic, the frequency stability higher than that of the oven controlled crystal oscillator (OCXO) of the related art can be realized.

2. Electronic Apparatus

Figure 11:
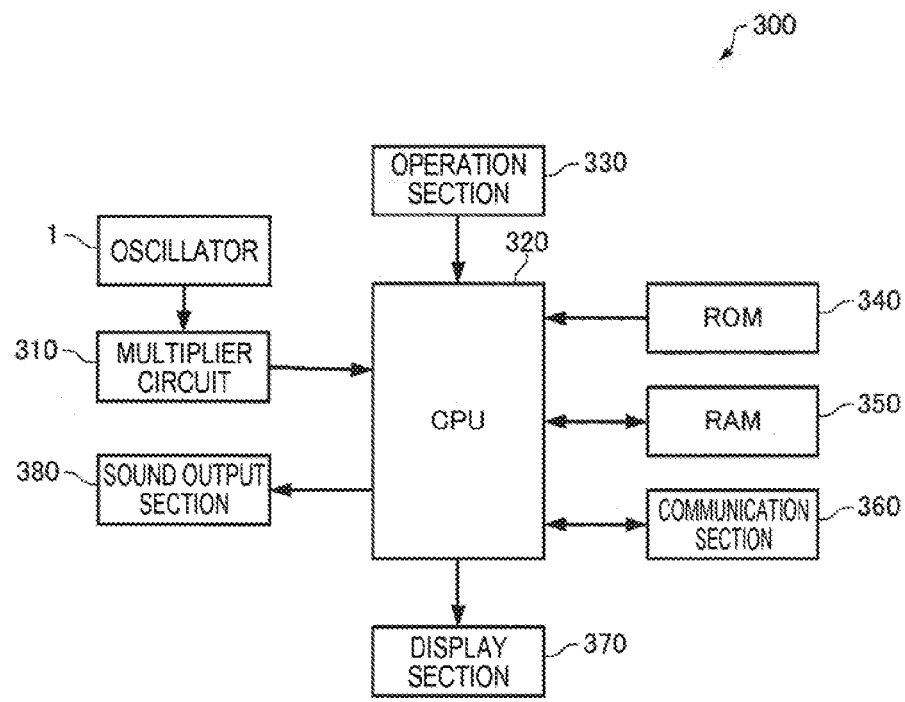
FIG. 11 is a functional block diagram of an electronic apparatus according to the present embodiment.

FIG. 11 is a functional block diagram of an electronic apparatus 300 according to the present embodiment. It should be noted that the constituents substantially the same as those of the embodiments described above are denoted by the same reference symbols, and the detailed description thereof will be omitted.

The electronic apparatus 300 according to the present embodiment is an electronic apparatus 300 including the oscillator 1. In the example shown in FIG. 11, the electronic apparatus 300 is configured including the oscillator 1, a multiplier circuit 310, a central processing unit (CPU) 320, an operation section 330, a read only memory (ROM) 340, a random access memory (RAM) 350, a communication section 360, a display section 370, and a sound output section 380. It should be noted that the electronic apparatus 300 according to the present embodiment can also have a configuration obtained by eliminating or modifying some of the constituents (the sections) shown in FIG. 11, or adding other constituents.

The multiplier circuit 310 supplies clock pulses not only to the CPU 320 but also to each of the sections (not shown). The clock pulses can also be a signal obtained by taking out a desired harmonic signal from the oscillation signal from the oscillator 1 including the oscillation element 20 using the multiplier circuit 310, or can also be a signal obtained by multiplying the oscillation signal from the oscillator 1 using the multiplier circuit 310 including a PLL synthesizer (not shown).

The CPU 320 performs a variety of arithmetic processes and control processes using the clock pulses output by the multiplier circuit 310 in accordance with the programs stored in the ROM 340 and so on. Specifically, the CPU 320 performs a variety of processes corresponding to the operation signal from the operation section 330, a process of controlling the communication section 360 for performing data communication with external devices, a process of transmitting a display signal for making the display section 370 display a variety of types of information, a process of making the sound output section 380 output a variety of sounds, and so on.

The operation section 330 is an input device including operation keys, button switches, and so on, and outputs the operation signal corresponding to the operation by the user to the CPU 320.

The ROM 340 stores the programs, data, and so on for the CPU 320 to perform the variety of arithmetic processes and control processes.

The RAM 350 is used as a working area of the CPU 320, and temporarily stores, for example, the programs and the data retrieved from the ROM 340, the data input from the operation section 330, and the arithmetic result obtained by the CPU 320 performing operations in accordance with the variety of programs.

The communication section 360 performs a variety of control processes for achieving the data communication between the CPU 320 and the external devices.

The display section 370 is a display device formed of a liquid crystal display (LCD), an electrophoretic display, or the like, and displays a variety of types of information based on the display signal input from the CPU 320.

Further, the sound output section 380 is a device, such as a speaker, for outputting sounds.

According to the electronic apparatus 300 related to the present embodiment, since there is included the oscillator 1 having the high frequency stability, the electronic apparatus 300 higher in reliability can be realized.

As the electronic apparatus 300, a variety of types of electronic apparatus can be adopted. There can be cited, for example, a personal computer (e.g., a mobile type personal computer, a laptop personal computer, and a tablet personal computer), a mobile terminal such as a cellular phone, a digital camera, an inkjet ejection device (e.g., an inkjet printer), a storage area network apparatus such as a router or a switch, a local area network apparatus, a mobile communication base station apparatus, a television set, a video camera, a video recorder, a car navigation system, a pager, a personal digital assistance (including one having a communication function), an electronic dictionary, an electronic calculator, an electronic game machine, a gaming controller, a word processor, a workstation, a picture phone, a security television monitor, an electronic binoculars, a POS (point-of-sale) terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

Figure 12:
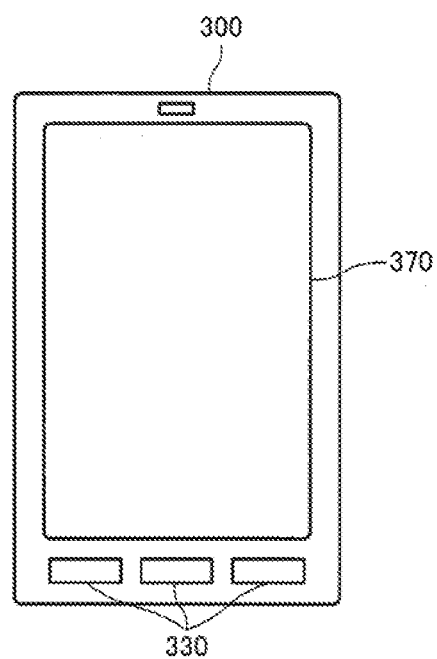
FIG. 12 is a diagram showing an example of an exterior appearance of a smartphone as an example of the electronic apparatus.

FIG. 12 is a diagram showing an example of an exterior appearance of a smartphone as an example of the electronic apparatus 300. The smartphone as the electronic apparatus 300 is provided with buttons as the operation sections 330, and an LCD as the display section 370. Further, since the smartphone as the electronic apparatus 300 includes the oscillator 1 having the high frequency stability, the electronic apparatus 300 higher in reliability can be realized.

3. Moving Object

Figure 13:
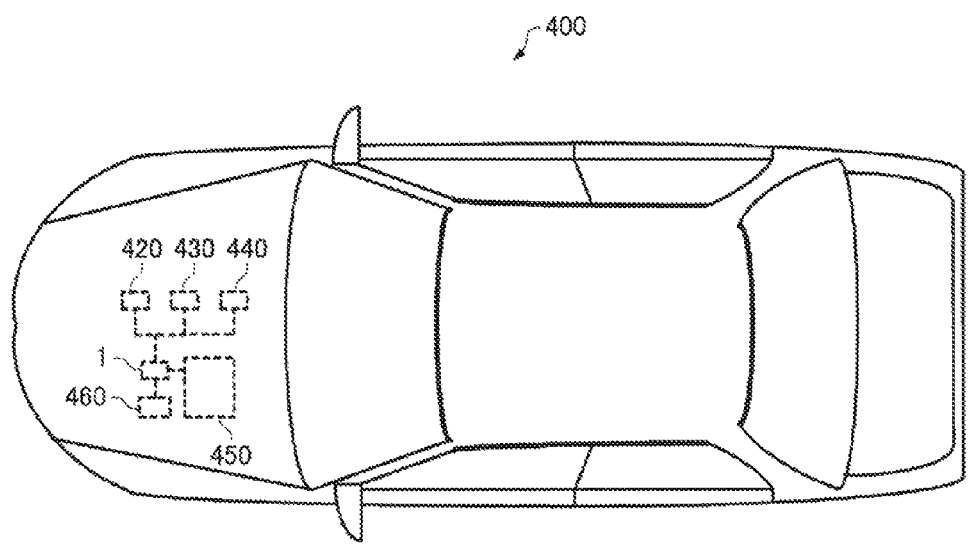
FIG. 13 is a diagram (a top view) showing an example of a moving object according to the present embodiment.

FIG. 13 is a diagram (a top view) showing an example of a moving object 400 according to the present embodiment. It should be noted that the constituents substantially the same as those of the embodiments described above are denoted by the same reference symbols, and the detailed description thereof will be omitted.

The moving object 400 according to the present embodiment is a moving object 400 including the oscillator 1. In the example shown in FIG. 13, the moving object 400 is configured including controllers 420, 430, and 440 for performing control of a variety of systems such as an engine system, a brake system, and a keyless entry system, a battery 450, and a backup battery 460. It should be noted that the moving object 400 according to the present embodiment can also have a configuration obtained by eliminating or modifying some of the constituents (the sections) shown in FIG. 13, or adding other constituents.

According to the moving object 400 related to the present embodiment, since there is included the oscillator 1 having the high frequency stability, the moving object 400 higher in reliability can be realized.

As such a moving object 400, a variety of types of moving objects can be adopted, and a vehicle (including an electric vehicle), an aircraft such a jet plane or a helicopter, a ship, a boat, a rocket, an artificial satellite, and so on can be cited.

The invention is not limited to the embodiments described above, but can be implemented with various modifications within the scope or the spirit of the invention.

The embodiments and the modified examples described above are illustrative only, and the invention is not limited to the embodiments and the modified examples. For example, it is also possible to arbitrarily combine any of the embodiments and the modified examples described above with each other.

The invention includes configurations (e.g., configurations having the same function, the same way, and the same result, or configurations having the same object and the same advantage) substantially the same as the configuration described as one of the embodiments of the invention. Further, the invention includes configurations obtained by replacing a non-essential part of the configuration explained in the above description of the embodiments. Further, the invention includes configurations providing the same functions and the same advantages or configurations capable of achieving the same object as that of the configurations explained in the embodiment section. Further, the invention includes configurations obtained by adding a known technology to the configuration explained in the description of the embodiments.

The entire disclosure of Japanese Patent Application No. 2015-017078, filed Jan. 30, 2015 is expressly incorporated by reference herein.

What is claimed is:

1. An oscillator comprising:
   an oscillation element;
   an oscillation circuit adapted to oscillate the oscillation element;
   a heat generation element adapted to heat the oscillation element;
   a temperature control circuit adapted to control the heat generation element; and
   a temperature correction signal generation circuit adapted to generate a temperature correction signal used to correct a frequency-temperature characteristic of an output signal of the oscillation circuit,
   wherein the temperature correction signal generation circuit includes
      a temperature sensor,
      a first-order correction signal generation circuit adapted to generate a first-order correction signal used to perform a first-order correction, and
      a high-order correction signal generation circuit adapted to generate a high-order correction signal used to perform a high-order correction, and
   the high-order correction signal generation circuit includes
      a high-temperature side second-order correction signal generation circuit adapted to generate a high-temperature side second-order correction signal used to perform a second-order correction on a high-temperature side higher than temperature in linear region of the frequency-temperature characteristic,
      a high-temperature side polarity switching circuit adapted to switch a polarity of the high-temperature side second-order correction signal,
      a low-temperature side second-order correction signal generation circuit adapted to generate a low-temperature side second-order correction signal used to perform the second-order correction on a low-temperature side lower than temperature in the linear region, and a low-temperature side polarity switching circuit adapted to switch a polarity of the low-temperature side second-order correction signal.

2. The oscillator according to claim 1, wherein
the temperature correction signal generation circuit includes a composition circuit adapted to add the first-order correction signal and the high-order correction signal to each other.

3. The oscillator according to claim 1, wherein
a reference temperature, at which a frequency of the output signal does not change due to the first-order correction signal, is within a temperature range detected by the temperature sensor.

4. The oscillator according to claim 2, wherein
a reference temperature, at which a frequency of the output signal does not change due to the first-order correction signal, is within a temperature range detected by the temperature sensor.

5. The oscillator according to claim 3, wherein
the reference temperature can variably be set.

6. The oscillator according to claim 4, wherein
the reference temperature can variably be set.

7. The oscillator according to claim 1, wherein
temperature, at which signal generation of one of the high-temperature side second-order correction signal generation circuit and the low-temperature side second-order correction signal generation circuit is started, is within a temperature range detected by the temperature sensor.

8. The oscillator according to claim 2, wherein
temperature, at which signal generation of one of the high-temperature side second-order correction signal generation circuit and the low-temperature side second-order correction signal generation circuit is started, is within a temperature range detected by the temperature sensor.

9. The oscillator according to claim 3, wherein
temperature, at which signal generation of one of the high-temperature side second-order correction signal generation circuit and the low-temperature side second-order correction signal generation circuit is started, is within a temperature range detected by the temperature sensor.

10. The oscillator according to claim 1, wherein
the temperature, at which the signal generation of the low-temperature side second-order correction signal generation circuit is started, is lower than the temperature, at which the signal generation of the high-temperature side second-order correction signal generation circuit is started.

11. The oscillator according to claim 2, wherein
the temperature, at which the signal generation of the low-temperature side second-order correction signal generation circuit is started, is lower than the temperature, at which the signal generation of the high-temperature side second-order correction signal generation circuit is started.

12. The oscillator according to claim 3, wherein
the temperature, at which the signal generation of the low-temperature side second-order correction signal generation circuit is started, is lower than the temperature, at which the signal generation of the high-temperature side second-order correction signal generation circuit is started.

13. The oscillator according to claim 1, wherein
the oscillation element is an SC-cut crystal resonator.

14. The oscillator according to claim 2, wherein
the oscillation element is an SC-cut crystal resonator.

15. The oscillator according to claim 3, wherein
the oscillation element is an SC-cut crystal resonator.

16. An electronic apparatus comprising:
the oscillator according to claim 1.

17. An electronic apparatus comprising:
the oscillator according to claim 2.

18. An electronic apparatus comprising:
the oscillator according to claim 3.

19. A moving object comprising:
the oscillator according to claim 1.

20. A moving object comprising:
the oscillator according to claim 2.

* * * * *